July 26, 1966 J. SASUGA 3,263,089

MOUNTING STRUCTURE FOR A PHOTOSENSITIVE DEVICE

Filed Jan. 29, 1962

INVENTOR.
JOHN SASUGA

BY

OSTROLENK, FABER, GERB & SOFFEN
ATTORNEYS 3,263,089

MOUNTING STRUCTURE FOR A PHOTO-SENSITIVE DEVICE

John Sasuga, Torrance, Calif., assignor to International Rectifier Corporation, El Segundo, Calif., a corporation of California Filed Jan. 29, 1962, Ser. No. 169,526
3 Claims. (Cl. 250—239)

This invention relates to a novel photosensitive device, and more specifically relates to a novel mounting structure for photosensitive elements such as a photosensitive selenium wafer.

Selenium photosensitive devices are well known in the art, and can be used, for example, in connection with cameras having automatic aperture control means for automatically adjusting the aperture opening, depending upon light intensity. It is common practice in such cameras to have a main photocell which drives an aperture control mechanism as well as small auxiliary cells which provide further aperture control, depending upon direct sunlight in the view to be photographed.

The invention is particularly applicable to a housing for such auxiliary photocells, although it will be obvious to those skilled in the art that the novel mounting arrangement of the invention can be universally applied.

A primary object of this invention is to provide a novel mounting structure for photosensitive elements which is simple in manufacture.

A further object of this invention is to provide a novel photosensitive device mounting structure which is economical.

Another object of this invention is to provide a novel photosensitive device mounting structure which is rugged, consists of a minimum of parts, and is extremely simple to assemble.

These and other objects of this invention will become apparent from the following description when taken in connection with the drawings, in which.

Figures 1, 2, 3:
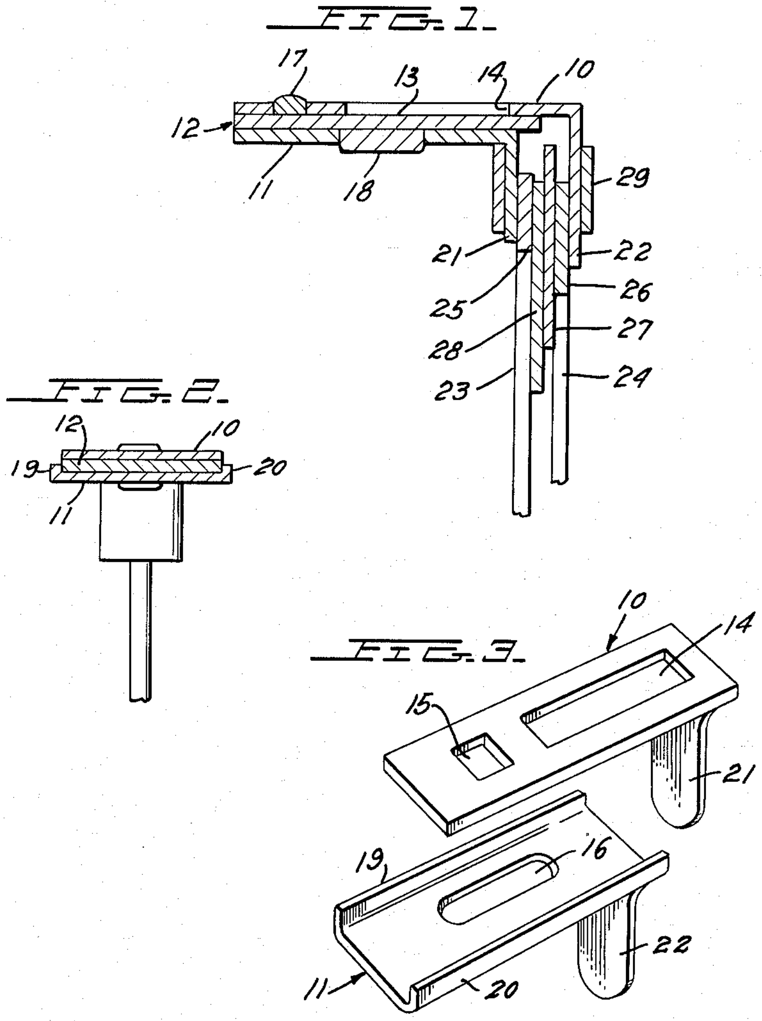
FIGURE 1 shows a side cross-sectional view of a housing for a photosensitive device constructed in accordance with the present invention.
FIGURE 2 is a side view of the housing of FIGURE 1 as seen from the left-hand side of FIGURE 1.
FIGURE 3 is an exploded perspective view of the top and bottom copper strips which serve as the upper and lower housing assemblies.

Referring first to FIGURES 1, 2 and 3, I have illustrated therein the novel housing as comprised of a top strip 10 and a bottom strip 11 which are placed on opposing surfaces of a photosensitive element 12 which could, for example, be a wafer of selenium appropriately processed to generate a photo-current when light falls upon the upper area 13 through window 14 in the top strip 10. Both top and bottom strips 10 and 11 are formed of a beryllium copper or Phosphor bronze having a thickness of the order of 0.008 inch. They are then appropriately finished by tin-plating with all burrs removed.

The top plate 10 has an opening 15 therein in addition to window 14, while the bottom plate 11 has an opening 16 therein where openings 15 and 16 serve to admit an appropriate solder for forming electrical connection to the upper and lower surfaces respectively of photosensitive element 12.

Thus, as seen in FIGURE 1, and after assembly of the device, a first drop of solder 17 solders upper plate 14 to the top surface of element 12, while a lower drop of solder 18 solders the lower plate 11 to the lower surface of element 12.

The bottom plate 11 is further formed with upwardly extending sections 19 and 20, whereby the wafer 12 is first laid atop the plate 11 and is grasped between sections 19 and 20 to facilitate assembly of the device.

Plates 11 and 12 further have extending portions 21 and 22 which receive lead wires 23 and 24 respectively, as shown in FIGURE 1. Thus, in FIGURE 1, each of lead wires 23 and 24 may be a No. 30 gauge 7–38 stranded copper wire having a vinyl cover. Portions 25 and 26 of wires 23 and 24 are removed, and are soldered to extending portion 21 and 22 respectively of plates 10 and 11 respectively. This operation is performed before any other subassembly so that the heat generated during the soldering operation will not affect the photosensitive wafer 12.

After this soldering operation, a thin insulating sheet 27 is laid over exposed wire portion 26, and a similar insulating sheet 28 may be laid over exposed wire portion 25. The wafer 12 is thereafter placed on the bottom plate 11, and the bottom plate 11 and top plate 10 are assembled in the manner shown so that they are in insulation relationship with respect to one another.

Thereafter, a short piece of insulation tubing 29 is slid over wires 23 and 24 and up to the region indicated in FIGURE 1 to hold the various subassemblies in position with respect to one another. The tubing 29 is of a type which will contract when exposed to heat, whereby after assembly, as shown in FIGURE 1, the tip of a soldering iron may be applied to tubing 29 to cause it to contract and thus hold the subassembly rigidly together. The drops of solder 17 and 18 are thereafter applied to electrically connected photosensitive element 12 in series with plates 10 and 11 and, thus, leads 23 and 24.

The complete unit may than be dipped in a thin transparent plastic which serves to weatherproof the unit.

Figures 4, 5, 6:
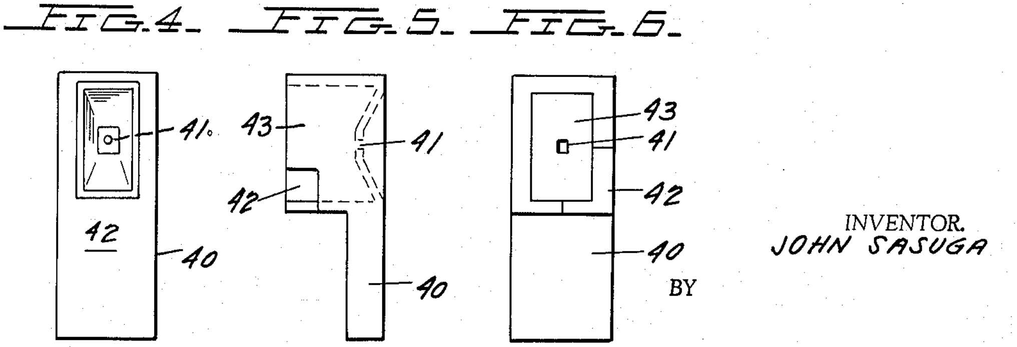
FIGURE 4 is a front view of a mounting for receiving the assembled photosensitive device of FIGURES 1, 2 and 3.
FIGURE 5 is a side view of the mounting of FIGURE 4.
FIGURE 6 is a rear view of the mounting of FIGURE 4.

In operation, incident radiation striking area 13 exposed by window 14 will cause the generation of an output current in leads 23 and 24 which may be connected to any appropriate circuit such as the circuit for controlling the lens aperture in a camera in accordance with the nature of the incident radiation.

Where desired, and after assembly of the unit, the sensitive area 13 may be further masked in any desired manner to obtain required output current.

Where the unit is to be used in a camera, for example, the novel housing assembly of FIGURES 1, 2 and 3 can be appropriately contained within a camera mounting shown in FIGURES 4, 5 and 6 which is carried on a camera. Thus, the camera mount is comprised of a body 40 which has an aperture 41 recessed in the front surface 42 (FIGURES 4 and 5) and which communicates with an internal opening 43.

The assembly of FIGURES 1, 2 and 3 is then laid within opening 43 with the window 14 registering with opening 41. A notched section 42, best seen in FIGURES 5 and 6, permits the leads 23 and 24 to be taken from the housing 40 and to the appropriate control mechanism within the camera.

The device may then be secured within the mounting 40 by inserting a piece of sponge rubber (not shown), and thereafter inserting an appropriate plug over the sponge rubber and secured to opening 43 in any desired manner.

Although this invention has been described with respect to its preferred embodiments, it should be understood that many variations and modifications will now be obvious to those skilled in the art, and it is preferred, therefore, that the scope of this invention be limited not by the specific disclosure herein but only by the appended claims.

What is claimed is:

1. A mounting structure for a flat photosensitive element; said mounting structure comprising a first and second conductive strip of uniform thickness positioned on opposite surfaces of said photosensitive element; said first strip having a window aperture and a solder aperture; said second conductive strip having a solder aperture; said solder apertures in said first and second conductive strips receiving solder for electrically connecting said first and second conductive strips to said respective opposite surfaces of said photosensitive element; said first and second conductive strips having lead receiving portions for receiving electrical leads; said lead receiving portions being formed of extensions of said first and second strips respectively; said extensions being at an angle to their said respective conductive strips.

2. A mounting structure for a flat photosensitive element; said mounting structure comprising a first and second conductive strip of uniform thickness positioned on opposite surfaces of said photosensitive element; said first strip having a window aperture and a solder aperture; said second conductive strip having a solder aperture; said solder apertures in said first and second conductive strips receiving solder for electrically connecting said first and second conductive strips to said respective opposite surfaces of said photosensitive element; said second conductive strip having a pair of extending sides for receiving said flat photosensitive element.

3. A mounting structure for a flat photosensitive element; said mounting structure comprising a first and second conductive strip of uniform thickness positioned on opposite surfaces of said photosensitive element; said first strip having a window aperture and a solder aperture; said second conductive strip having a solder aperture; said solder apertures in said first and second conductive strips receiving solder for electrically connecting said first and second conductive strips to said respective opposite surfaces of said photosensitive element; said first and second conductive strips having lead receiving portions for receiving electrical leads; said lead receiving portions being formed of extensions of said first and second strips respectively; said extensions being at an angle to their said respective conductive strips; said extensions being connected by a thermally sensitive plastic tube to secure said first and second strips together; said extensions lying in parallel planes and being electrically insulated from one another.

References Cited by the Examiner

UNITED STATES PATENTS

| | | | | |
|---|---|---|---|---|
| 1,316,350 | 9/1919 | Case | 250–211 | X |
| 2,019,457 | 10/1935 | Lodge | 338–329 | X |
| 2,183,256 | 12/1939 | Gabler | 250–239 | X |
| 2,786,145 | 3/1957 | Maninger | 338–19 | X |
| 2,975,335 | 3/1961 | Harris | 250–239 | X |
| 3,072,796 | 1/1963 | Eaton | 250–239 | X |
| 3,117,297 | 1/1964 | De Gier | 338—19 | |

RALPH G. NILSON, *Primary Examiner.*